United States Patent
Kim et al.

(10) Patent No.: US 12,125,433 B2
(45) Date of Patent: Oct. 22, 2024

(54) DISPLAY DEVICE

(71) Applicant: Samsung Display Co., LTD., Yongin-si (KR)

(72) Inventors: Ki Wook Kim, Hwaseong-si (KR); Yang Wan Kim, Hwaseong-si (KR); Ji Su Na, Yongin-si (KR); Joong Soo Moon, Hwaseong-si (KR); Kyoung Jin Park, Hwaseong-si (KR); Myeong Hee Seo, Hwaseong-si (KR); Seon I Jeong, Cheonan-si (KR); Chang Kyu Jin, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/495,807

(22) Filed: Oct. 6, 2021

(65) Prior Publication Data
US 2022/0208088 A1    Jun. 30, 2022

(30) Foreign Application Priority Data
Dec. 31, 2020   (KR) ........................ 10-2020-0189826

(51) Int. Cl.
*G09G 3/3208*   (2016.01)
*H10K 50/813*   (2023.01)
(Continued)

(52) U.S. Cl.
CPC ......... *G09G 3/3208* (2013.01); *H10K 50/813* (2023.02); *H10K 59/1216* (2023.02);
(Continued)

(58) Field of Classification Search
CPC ... G09G 2300/0426; G09G 2300/0452; G09G 2320/0247; G09G 2300/043; G09G 3/3233; G09G 2320/0209; G09G 2320/0233; G09G 2300/0439; G09G 2320/0252; G09G 3/3208; G09G 2320/043; G09G 2320/045; G09G 3/3291; G09G 5/10; G09G 3/1213; G09G 3/32; G09G 3/20; G09G 3/3225;
(Continued)

(56) References Cited

U.S. PATENT DOCUMENTS 10,950,174 B2   3/2021   Kim et al.
11,107,868 B2   8/2021   Jeon et al.
(Continued)

FOREIGN PATENT DOCUMENTS

KR   1020180072303 A   6/2018
KR   1020200003949     1/2020
(Continued)

*Primary Examiner* — Ricardo Osorio
(74) *Attorney, Agent, or Firm* — CANTOR COLBURN LLP

(57) ABSTRACT

A display device includes: a plurality of data lines extending in a first direction, and first to third pixels connected to the plurality of data lines. The first pixel includes a first pixel electrode overlapping the plurality of data lines in a plan view in a thickness direction. The second pixel includes a second pixel electrode spaced apart from the plurality of data lines in the plan view in the thickness direction. The third pixel includes a third pixel electrode overlapping the plurality of data lines in the plan view in the thickness direction.

20 Claims, 10 Drawing Sheets

(51) Int. Cl.
*H10K 59/121* (2023.01)
*H10K 59/124* (2023.01)
*H10K 59/131* (2023.01)

(52) U.S. Cl.
CPC ......... H10K 59/124 (2023.02); H10K 59/131 (2023.02); *G09G 2300/0439* (2013.01); *G09G 2300/0809* (2013.01); *G09G 2310/08* (2013.01)

(58) Field of Classification Search
CPC ........ G09G 2300/0809; G09G 2310/08; H01L 27/3276; H01L 27/3248; H01L 27/3216; G02F 1/1343; G02F 2201/123; G02F 1/155; G02F 1/13624; G02F 1/1362; H10K 50/813; H10K 50/81; H10K 59/1216; H10K 59/124; H10K 59/131; H10K 59/353; H10K 59/1213; H10K 59/12; H10K 59/352

See application file for complete search history.

(56) References Cited

U.S. PATENT DOCUMENTS

| | | | |
|---|---|---|---|
| 11,195,462 B2 | 12/2021 | Kim et al. | |
| 11,482,173 B2 | 10/2022 | Kim et al. | |
| 11,800,754 B2 | 10/2023 | Moon et al. | |
| 12,035,569 B2 | 7/2024 | Shin et al. | |
| 2013/0070002 A1* | 3/2013 | Hisada | G02F 1/134336 362/231 |
| 2014/0292622 A1* | 10/2014 | Lee | H01L 27/3216 345/80 |
| 2016/0155983 A1* | 6/2016 | Lee | H01L 51/5281 257/40 |
| 2017/0045794 A1* | 2/2017 | Lin | H01L 27/124 |
| 2018/0040682 A1* | 2/2018 | Ebisuno | H10K 59/126 |
| 2018/0174511 A1* | 6/2018 | Kim | H01L 27/3218 |
| 2019/0206955 A1* | 7/2019 | Paek | H01L 27/3246 |
| 2020/0119115 A1* | 4/2020 | Moon | H01L 27/3276 |
| 2020/0381507 A1* | 12/2020 | Park | H01L 28/60 |
| 2021/0304672 A1* | 9/2021 | Kim | H10K 59/1213 |
| 2023/0031335 A1 | 2/2023 | Kim et al. | |
| 2024/0057406 A1 | 2/2024 | Moon et al. | |

FOREIGN PATENT DOCUMENTS

| | | |
|---|---|---|
| KR | 1020200037027 A | 4/2020 |
| KR | 1020200040967 A | 4/2020 |
| KR | 1020200074593 | 6/2020 |
| KR | 1020200076407 | 6/2020 |
| KR | 1020200080012 | 7/2020 |
| KR | 1020200083803 A | 7/2020 |
| KR | 1020200108395 A | 9/2020 |

* cited by examiner

DISPLAY DEVICE

This application claims priority to Korean Patent Application No. 10-2020-0189826, filed on Dec. 31, 2020, and all the benefits accruing therefrom under 35 U.S.C. § 119, the content of which in its entirety is herein incorporated by reference.

BACKGROUND

1. Field

The disclosure relates to a display device.

2. Description of the Related Art

With the advance of an information-oriented society, demands on display devices for displaying images are increasing in various fields. For example, display devices are employed in various electronic devices such as smartphones, digital cameras, laptop computers, navigation devices, and smart televisions. In a display device, where each of pixels of a display panel includes a light emitting element capable of emitting light by itself, an image may be displayed without a backlight unit for providing light to the display panel.

The display device may include a plurality of pixels, data lines and gate lines connected to the plurality of pixels, a data driver that supplies a data voltage to the data lines, and a gate driver that supplies a gate signal to the gate lines. The data driver and the gate driver may drive a plurality of pixels according to a predetermined frequency.

SUMMARY

Aspects of the disclosure provide a display device in which stains due to coupling between a pixel electrode and a data line are effectively prevented from being visually recognized in a display area by preventing pixel electrodes of some of a plurality of pixels from being affected by coupling at a rising edge or a falling edge of a data voltage.

According to an embodiment of the disclosure, a display device includes: a plurality of data lines extending in a first direction, and first to third pixels connected to the plurality of data lines. In such an embodiment, the first pixel includes a first pixel electrode overlapping the plurality of data lines in a plan view in a thickness direction, the second pixel includes a second pixel electrode spaced apart from the plurality of data lines in the plan view in the thickness direction, and the third pixel includes a third pixel electrode overlapping the plurality of data lines in the plan view in the thickness direction.

In an embodiment, the first pixel may emit red light, the second pixel may emit green light, and the third pixel may emit blue light.

In an embodiment, an area of the first pixel electrode may be larger than an area of the second pixel electrode, and an area of the third pixel electrode may be larger than an area of the first pixel electrode.

In an embodiment, the third pixel electrode may be spaced apart from the first pixel electrode in the first direction or in a second direction perpendicular to the first direction, and the second pixel electrode may be spaced apart from the first pixel electrode or the third pixel electrode in an oblique direction with respect to the first direction and the second direction.

In an embodiment, the first pixel electrode and the third pixel electrode may be disposed in a same row or a same column, and the second pixel electrode may be disposed in a different row and a different column from the first and third pixel electrodes.

In an embodiment, the plurality of data lines may comprise first and second data lines adjacent to each other, the first pixel may further include a first pixel circuit connected between the first data line and the first pixel electrode, the second pixel may further comprise a second pixel circuit connected between the second data line and the second pixel electrode, the third pixel may further comprise a third pixel circuit connected between the first data line and the third pixel electrode.

In an embodiment, the plurality of data lines may further include third and fourth data lines spaced apart from the first and second data lines and adjacent to each other, and the second pixel electrode may be disposed between the second data line and the third data line.

In an embodiment, the display device may further include a driving voltage line disposed in a same layer as the first to fourth data lines and disposed between the second and third data lines.

In an embodiment, a center portion of a first opening area, from which the first pixel emits light, and a center portion of a third opening area, from which the third pixel emits light, may be spaced apart from the driving voltage line in the plan view in the thickness direction, and a second opening area, from which the second pixel emits light, may overlap the driving voltage line in the plan view in the thickness direction.

In an embodiment, the first pixel circuit may include: a first transistor which controls a driving current flowing through the first pixel electrode, a second transistor which supplies a data voltage to a first node, which is connected to a source electrode of the first transistor, a third transistor which connects a second node, which is connected to a drain electrode of the first transistor, to a third node, which is connected to a gate electrode of the first transistor, and a first coupling capacitor connected between the first data line and a fourth node, which is connected to the first pixel electrode.

In an embodiment, the second pixel circuit may include: a first transistor which controls a driving current flowing through the second pixel electrode, a second transistor which supplies a data voltage to a first node, which is connected to a source electrode of the first transistor, based on a first gate signal, a third transistor which connects a second node, which is connected to a drain electrode of the first transistor, to a third node, which is connected to a gate electrode of the first transistor, based on a second gate signal, and a second coupling capacitor connected between the second data line and a fourth node, which is connected to the second pixel electrode.

In an embodiment, a capacitance of the first coupling capacitor may be greater than a capacitance of the second coupling capacitor.

In an embodiment, the first pixel circuit may further include: a fourth transistor which supplies a first initialization voltage to the third node based on a third gate signal, a fifth transistor which supplies a driving voltage to the first node based on an emission signal, a sixth transistor which connects the second node to the fourth node based on the emission signal, and a seventh transistor which supplies a second initialization voltage to the fourth node based on a fourth gate signal.

In an embodiment, the first pixel circuit may further include an eighth transistor which supplies a bias voltage to the first node based on the fourth gate signal.

In an embodiment, each of the first transistor, the second transistor, the fifth transistor, the sixth transistor, and the seventh transistor may correspond to a transistor of a first type, and each of the third transistor and the fourth transistor may correspond to a transistor of a second type different from the first type.

In an embodiment, the first pixel circuit may receive each of the first to third gate signals once during one frame period, and may receive the fourth gate signal multiple times during the one frame period.

In an embodiment, the first pixel circuit may receive the first to third gate signals during a first period in one frame period, and may receive the fourth gate signal during the first period and a second period other than the first period in the one frame period.

In an embodiment, the display device may further include: a substrate, a thin film transistor disposed on the substrate, a passivation layer covering the thin film transistor, and a planarization layer disposed on the passivation layer. In such an embodiment, the first and second data lines may be disposed on the passivation layer, and the first to third pixel electrodes may be disposed on the planarization layer.

In an embodiment, a distance between the first data line and the first pixel electrode may be shorter than a distance between the second data line and the second pixel electrode.

In an embodiment, a distance between the first data line and the third pixel electrode may be shorter than a distance between the second data line and the second pixel electrode.

In accordance with embodiments of the display device, pixel electrodes of some pixels may overlap a plurality of data lines, and pixel electrodes of other pixels may not overlap the plurality of data lines. In such embodiments, the capacitance between the data line and the pixel electrodes of some pixels may be relatively great, and the capacitance between the data line and the pixel electrodes of some other pixels may be relatively small. Therefore, the pixel electrodes of some pixels that output light of a first color may be affected by coupling corresponding to a change in the data voltage, but the pixel electrodes of other pixels that output light of a second color may not be affected by coupling even when the data voltage changes. In such embodiments of the display device, stains due to such coupling may be effectively prevented from being visually recognized in a partial area of the display area.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
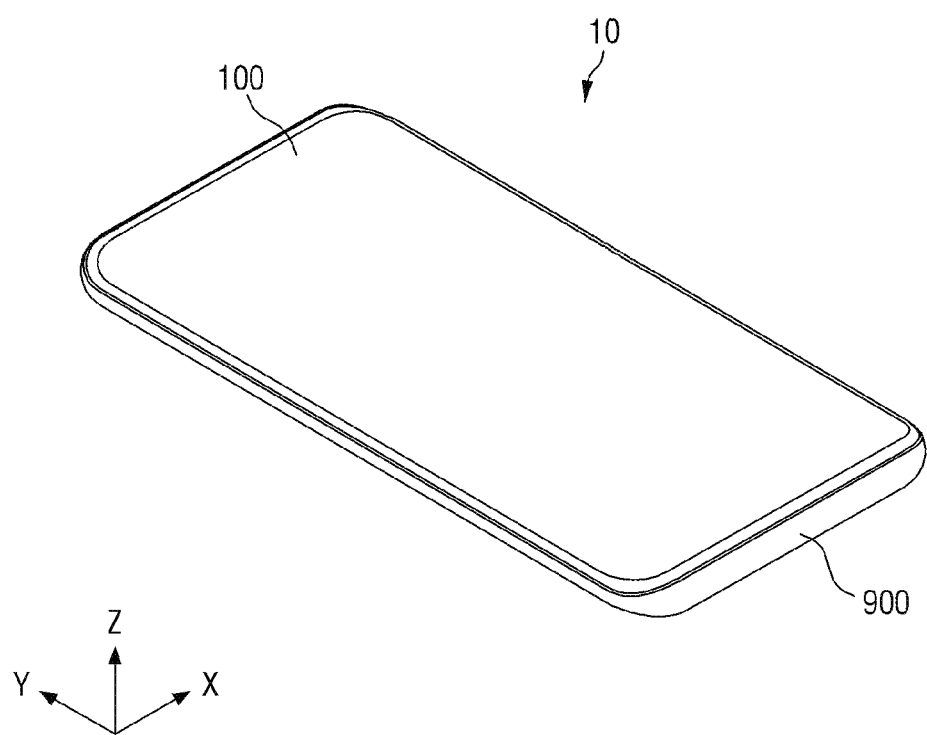
FIG. 1 is a perspective view illustrating a display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from X, Y, and Z" may be construed as X only, Y only, Z only, or any combination of two or more of X, Y, and Z, such as, for instance, XYZ, XYY, YZ, and ZZ.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
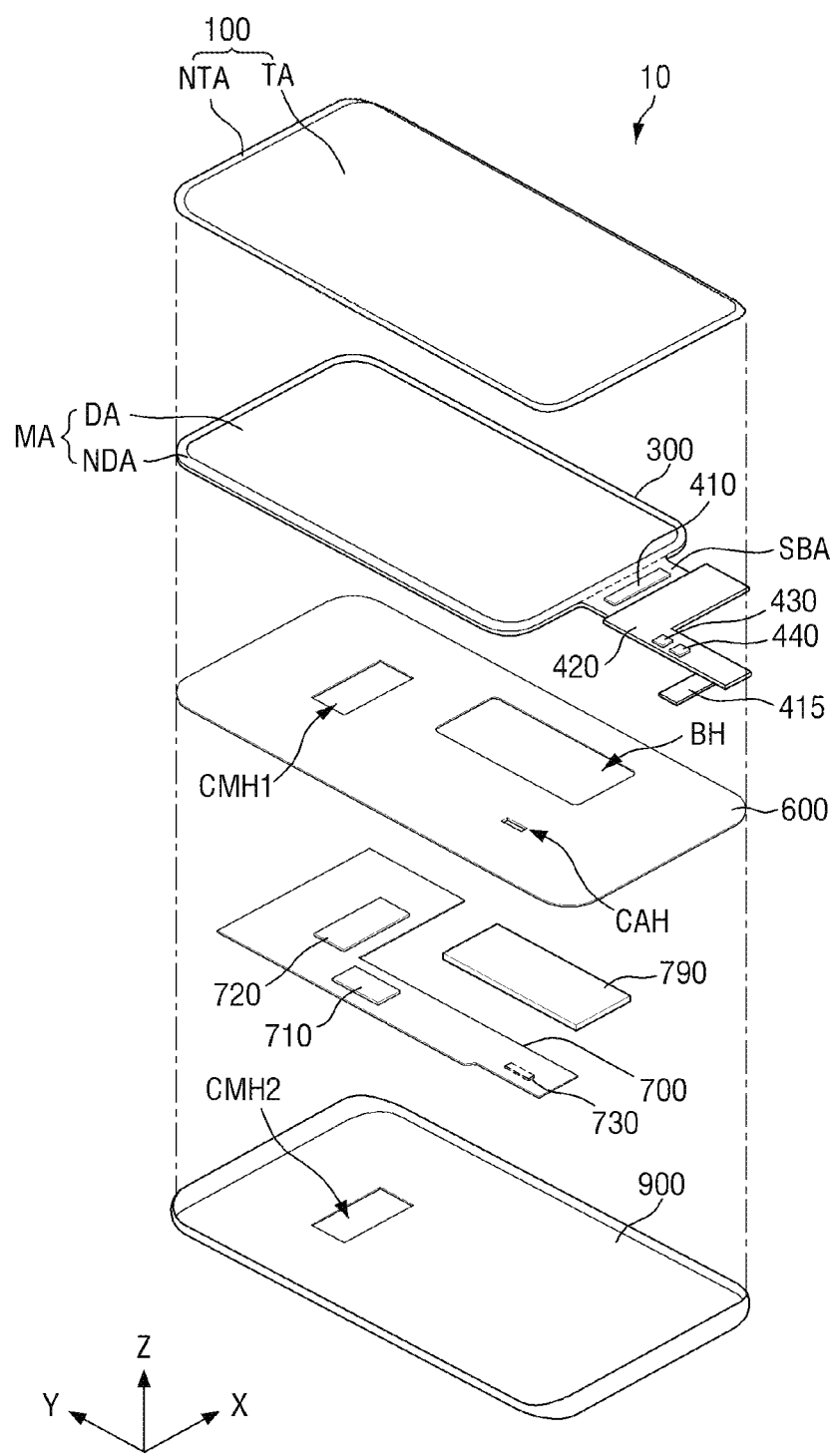
FIG. 2 is an exploded perspective view illustrating a display device according to an embodiment.

FIG. 1 is a perspective view illustrating a display device according to an embodiment. FIG. 2 is an exploded perspective view illustrating a display device according to an embodiment.

Referring to FIGS. 1 and 2, an embodiment of a display device 10 includes a cover window 100, a display panel 300, a bracket 600, a main circuit board 700, and a lower cover 900.

The terms "above," "top" and "top surface" as used herein refer to an upward direction (i.e., a Z-axis direction) with respect to the display device 10. The terms "below," "bottom" and "bottom surface" as used herein refer to a downward direction (i.e., a direction opposite to the Z-axis direction) with respect to the display device 10. Further, "left", "right", "upper" and "lower" indicate directions when the display device 10 is viewed from above. Herein, for example, the term "left" indicates a direction opposite to an X-axis direction, the term "right" indicates the X-axis direction, the term "upper" indicates a Y-axis direction, and the term "lower" indicates a direction opposite to the Y-axis direction.

The display device 10 is a device for displaying a moving image or a still image. The display device 10 may be used as a display screen of various products such as televisions, laptop computers, monitors, billboards and the Internet of Things ("IOT") as well as portable electronic devices such as mobile phones, smart phones, tablet personal computers ("PC"s), smart watches, watch phones, mobile communication terminals, electronic notebooks, electronic books, portable multimedia players ("PMP"s), navigation systems and ultra-mobile PCs ("UMPC"s).

In an embodiment, the display device 10 may have a rectangular shape in a plan view, that is, when viewed from a plan view in a thickness direction of the display device 10. In one embodiment, for example, the display device 10 may have a rectangular shape, in a plan view, having short sides in an X-axis direction and long sides in a Y-axis direction, as shown in FIGS. 1 and 2. The corner where the short side in the X-axis direction and the long side in the Y-axis direction meet may be rounded to have a predetermined curvature or may be right-angled. The planar shape of the display device 10 is not limited to a rectangular shape, and alternatively, the planar shape of the display device 10 may be in another polygonal shape, a circular shape, or an elliptical shape.

The cover window 100 may be disposed on the display panel 300 to cover a top surface of the display panel 300. The cover window 100 may protect the top surface of the display panel 300.

In an embodiment, as shown in FIG. 2, the cover window 100 may include a transmissive portion TA corresponding to a display area DA of the display panel 300 and a light blocking portion NTA corresponding to a non-display area NDA of the display panel 300. The transmissive portion TA may include a transparent material and transmit light from the display area DA. The light blocking portion NTA may include an opaque material. In one embodiment, for example, the light blocking portion NTA may include a decorative layer on which a pattern visually recognized by a user is formed.

The display panel 300 may be disposed below the cover window 100. Accordingly, the image displayed by the display panel 300 may be seen on the top surface of the display device 10 through the cover window 100.

The display panel 300 may be alight emitting display panel including a light emitting element. In one embodiment, for example, the display panel 300 may be an organic light emitting display panel using an organic light emitting diode including an organic light emitting layer, a micro light emitting diode display panel using a micro light emitting diode, a quantum dot light emitting display panel using a quantum dot light emitting diode including a quantum dot light emitting layer, or an inorganic light emitting display panel using an inorganic light emitting element including an inorganic semiconductor. Hereinafter, for convenience of description, embodiments where the display panel 300 is an organic light emitting display panel will be described.

In an embodiment, as shown in FIG. 2, the display panel 300 may include a main region MA and a sub-region SBA.

The main region MA may include the display area DA including pixels for displaying an image and the non-display area NDA disposed around the display area DA. The display area DA may emit light from a plurality of emission areas or a plurality of opening areas. In one embodiment, for example, the display panel 300 may include a pixel circuit including switching elements, a pixel defining layer defining an emission area or an opening area, and a self-light emitting element.

The non-display area NDA may surround the display area DA. The non-display area NDA may be defined as an edge area of the main region MA of the display panel 300. The non-display area NDA may include a gate driver (not illustrated) that supplies gate signals to the gate lines, and fan-out lines (not illustrated) that connect the display driver 410 to the display area DA.

The sub-region SBA may extend from one side of the main region MA. The sub-region SBA may include a flexible material which is bendable, foldable or rollable. In one embodiment, for example, where the sub-region SBA is bent, the sub-region SBA may overlap the main region MA in a thickness direction (or a Z-axis direction). The sub-region SBA may include the display driver 410 and a pad portion connected to the circuit board 420. Alternatively, the sub-region SBA may be omitted, and the display driver 410 and the pad portion may be arranged in the non-display area NDA.

The display panel 300 may include a display driver 410, a circuit board 420, a power supply unit 430, and a touch driver 440.

The display driver 410 may output signals and voltages for driving the display panel 300. The display driver 410 may supply a data voltage to a data line. The display driver 410 may supply a power voltage received from the power supply unit 430 to a power line, and may supply a gate control signal to the gate driver. In one embodiment, for example, the display driver 410 may be in a form of an integrated circuit ("IC") and may be mounted on the sub-region SBA of the display panel 300 using a chip on glass ("COG") method, a chip on plastic ("COP") method, or an ultrasonic bonding method.

In an embodiment, the circuit board 420 may be attached onto the pad portion using an anisotropic conductive film ("ACF"). In such an embodiment, lead lines of the circuit board 420 may be electrically connected to the pad portion of the display panel 300. In one embodiment, for example, the circuit board 420 may be a flexible printed circuit board, a printed circuit board ("PCB"), or a flexible film such as a chip on film ("COF").

The power supply unit 430 may be disposed on the circuit board 420 to supply a power voltage to the display driver 410 and the display panel 300. The power supply unit 430 may generate a driving voltage to supply the driving voltage to a driving voltage line, and may generate a common voltage to supply the common voltage to a common electrode that is commonly provided for light emitting elements of a plurality of pixels. In one embodiment, for example, the driving voltage may be a high potential voltage for driving the light emitting element, and the common voltage may be a low potential voltage for driving the light emitting element.

The touch driver 440 may be disposed on the circuit board 420 to measure the capacitance of touch electrodes. In one embodiment, for example, the touch driver 440 may determine whether a touch event (e.g., a user's touch) occurs on the display panel 300, the position of the touch event or the like, based on the change in capacitance of the touch electrodes. Here, the user's touch means that an object such as a user's finger or pen is in contact with one surface of the display device 10 disposed on a touch electrode layer. In such an embodiment, the touch driver 440 may determine the user's touch position by distinguishing a portion of the touch electrodes where the user's touch occurs from a portion where no user's touch occurs.

The bracket 600 may be disposed below the display panel 300. The bracket 600 may include or be made of a plastic, a metal, or a combination thereof. In one embodiment, for example, a first camera hole CMH1, into which a camera sensor 720 is inserted, a battery hole BH, in which a battery 790 is disposed, and a cable hole CAH, through which a cable connected to the display driver 410 or the circuit board 420 passes, may be defined through the bracket 600.

The main circuit board 700 and the battery 790 may be disposed below the bracket 600. The main circuit board 700 may be a printed circuit board or a flexible printed circuit board.

The main circuit board 700 may include a main processor 710, a camera sensor 720, and a main connector 730. The main processor 710 may be disposed on a top surface of the main circuit board 700, the camera sensors 720 may be disposed on both the top and bottom surfaces of the main circuit board 700, and the main connector 730 may be disposed on the bottom surface of the main circuit board 700.

The main processor 710 may control entire functions of the display device 10. In one embodiment, for example, the main processor 710 may supply digital video data to the display driver 410 such that the display panel 300 displays an image. The main processor 710 may receive touch data from the touch driver 440 and determine the user's touch coordinates, and then execute an application indicated by an icon displayed on the user's touch coordinates.

The main processor 710 may convert image data inputted from the camera sensor 720 into digital video data and provide the digital video data to the display driver 410 through the circuit board 420, thereby displaying an image captured by the camera sensor 720 on the display panel 300.

The camera sensor 720 may process an image frame of a still image or video obtained by the image sensor and output the processed image frame to the main processor 710. In one embodiment, for example, the camera sensor 720 may be a complementary metal oxide semiconductor ("CMOS") image sensor or a charge coupled device ("CCD") sensor, but is not limited thereto. The camera sensor 720 may be exposed to the bottom surface of the lower cover 900 by a second camera hole CMH2, and capture an image of a background or an object disposed below the display device 10.

The main connector 730 may be connected to the cable 415 through the cable hole CAH of the bracket 600. Thus, the main circuit board 700 may be electrically connected to the display driver 410 or the circuit board 420.

The battery 790 may not overlap the main circuit board 700 in a third direction (e.g., a Z-axis direction or the thickness direction). The battery 790 may be inserted into the battery hole BH of the bracket 600.

The lower cover 900 may be disposed below the main circuit board 700 and the battery 790. The lower cover 900 may be fixed or fastened to the bracket 600. The lower cover 900 may form or define an external appearance of the bottom surface of the display device 10. The lower cover 900 may include or be made of a plastic, a metal, or a combination thereof.

In an embodiment, a second camera hole CMH2, through which the bottom surface of the camera sensor 720 is exposed, may be defined through the lower cover 900. The position of the camera sensor 720 and the positions of the first and second camera holes CMH1 and CMH2 corresponding to the camera sensor 720 are not limited to those of the embodiment illustrated in FIG. 2.

Figure 3:
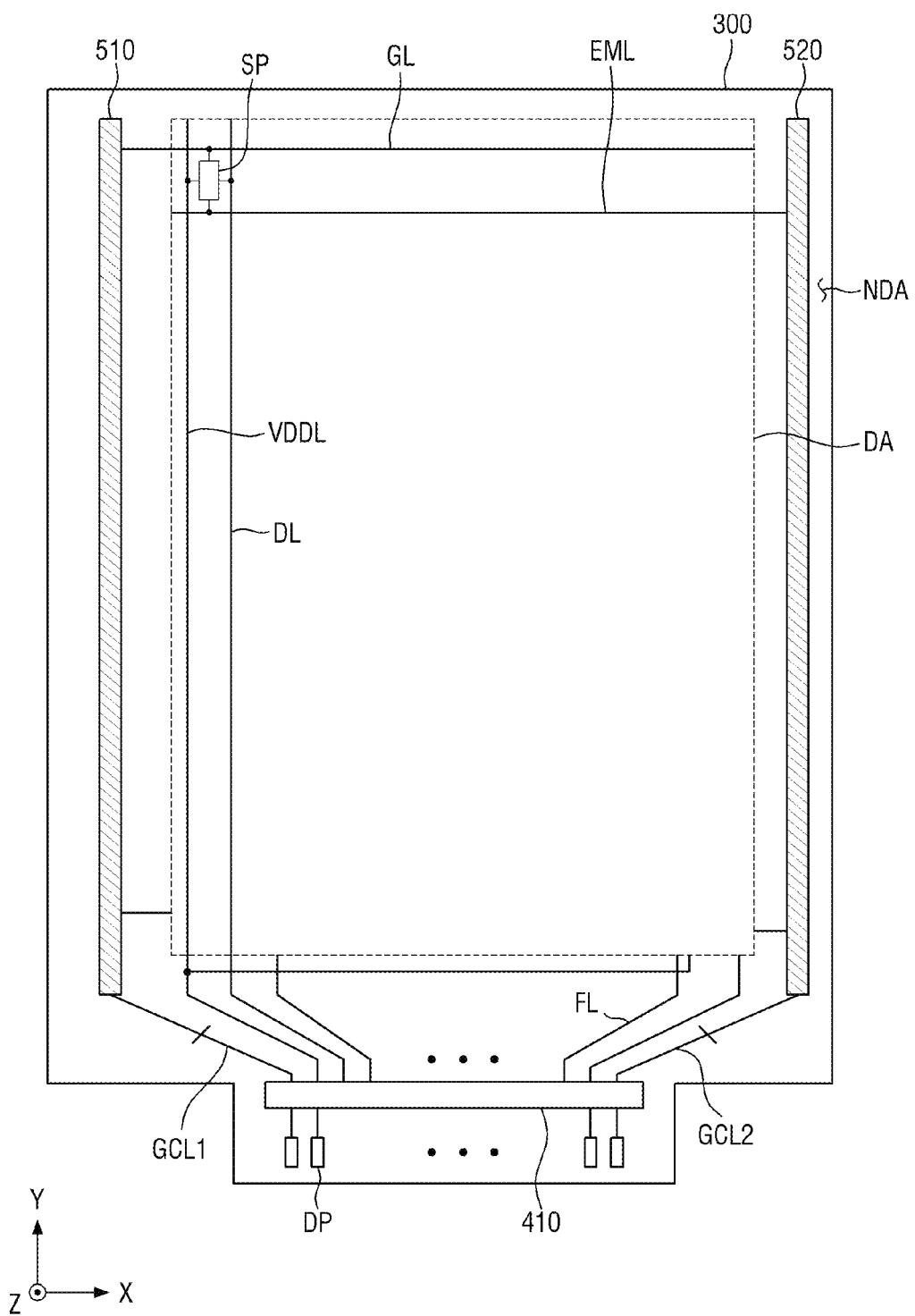
FIG. 3 is a plan view illustrating a display panel according to an embodiment.
Figure 4:
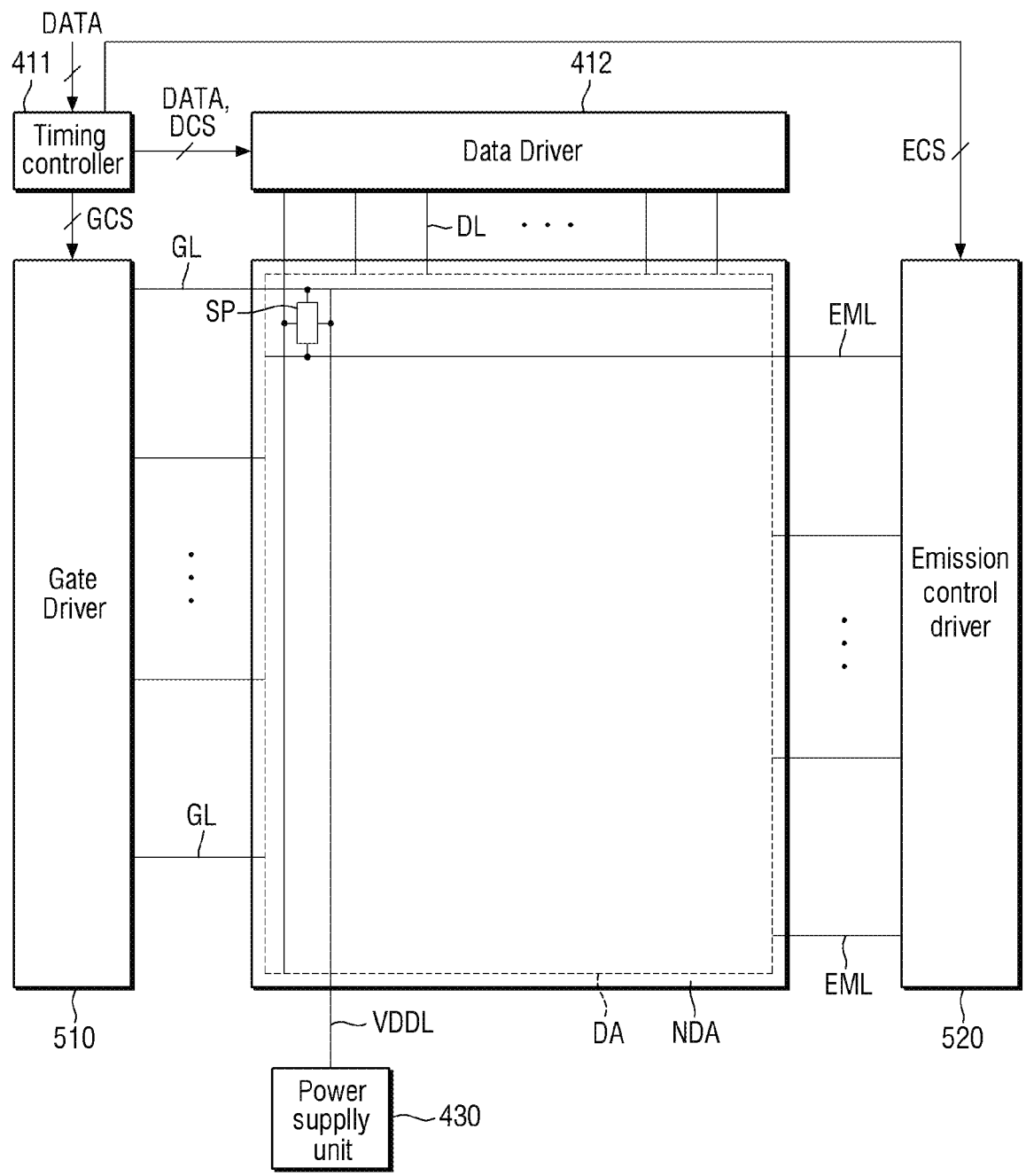
FIG. 4 is a block diagram illustrating a display panel and a display driver according to an embodiment.

FIG. 3 is a plan view illustrating a display panel according to an embodiment. FIG. 4 is a block diagram illustrating a display panel and a display driver according to an embodiment.

Referring to FIGS. 3 and 4, an embodiment of the display panel 300 may include the display area DA and the non-display area NDA.

The display area DA may include a plurality of pixels SP, and a plurality of driving voltage lines VDDL, a plurality of gate lines GL, a plurality of emission control lines EML, and a plurality of data lines DL connected to the pixels SP.

Each of the pixels SP may be connected to a corresponding one of the gate lines GL, the data line DL, a corresponding one of the emission control lines EML, and a corresponding one of the driving voltage lines VDDL. Each of the pixels SP may include a transistor, a light emitting element and a capacitor.

The gate lines GL may extend in the X-axis direction and may be spaced apart from each other in the Y-axis direction that crosses the X-axis direction. The gate lines GL may sequentially supply gate signals to the pixels SP.

The emission control lines EML may extend in the X-axis direction and may be spaced apart from each other in the Y-axis direction. The emission control lines EML may sequentially supply emission signals to the pixels SP.

The data lines DL may extend in the Y-axis direction and may be spaced apart from each other in the X-axis direction.

The data lines DL may supply the data voltage to the pixels SP. The data voltage may determine the luminance of each of the pixels SP.

The driving voltage lines VDDL may extend in the Y-axis direction and may be spaced apart from each other in the X-axis direction. The driving voltage lines VDDL may supply a driving voltage to the pixels SP. The driving voltage may be a high potential voltage for driving the light emitting elements of the pixels SP.

The non-display area NDA may be defined as the remaining area of the display panel 300 except for the display area DA. The non-display area NDA may include a gate driver 510 that applies gate signals to the gate lines GL, an emission control driver 520 that applies emission signals to the emission control lines EML, a plurality of fan-out lines FL connecting the data lines DL to the display driver 410 and a pad portion DP connected to the circuit board 420. In one embodiment, for example, the display driver 410 and the pad portion DP may be disposed in the sub-region SBA of the display panel 300. The pad portion DP may be disposed closer to one edge of the sub-region SBA than the display driver 410 is.

The display driver 410 may include a timing controller 411 and a data driver 412.

The timing controller 411 may receive digital video data DATA and timing signals from the circuit board 420. The timing controller 411 may generate, based on the timing signals, a data control signal DCS to control the operation timing of the data driver 412, a gate control signal GCS to control the operation timing of the gate driver 510, and an emission control signal ECS to control the operation timing of the emission control driver 520. The timing controller 411 may supply the gate control signal GCS to the gate driver 510 through a first gate control line GCL1. The timing controller 411 may supply the emission control signal ECS to the emission control driver 520 through a second gate control line GCL2. The timing controller 411 may output the digital video data DATA and the data control signal DCS to the data driver 412.

The data driver 412 may convert the digital video data DATA into analog data voltages and output the analog data voltages to the data lines DL through the fan-out lines FL. The gate signals of the gate driver 510 may select pixels SP to which the data voltage is supplied, and the selected pixels SP may receive the data voltage through the data lines DL.

The gate driver 510 may be disposed at one outer side of the display area DA or at one side of the non-display area NDA. The emission control driver 520 may be disposed at another outer side of the display area DA or at another side of the non-display area NDA. However, the disclosure is not limited thereto. In one embodiment, for example, the gate driver 510 and the emission control driver 520 may be disposed at any one of one side and another side of the non-display area NDA.

The gate driver 510 may include a plurality of transistors that generate gate signals based on the gate control signal GCS. The emission control driver 520 may include a plurality of transistors that generate emission signals based on the emission control signal ECS. In one embodiment, for example, the transistors of the gate driver 510 and the transistors of the emission control driver 520 may be disposed or formed in (or directly on) a same layer as the transistors of each pixel SP.

Figure 5:
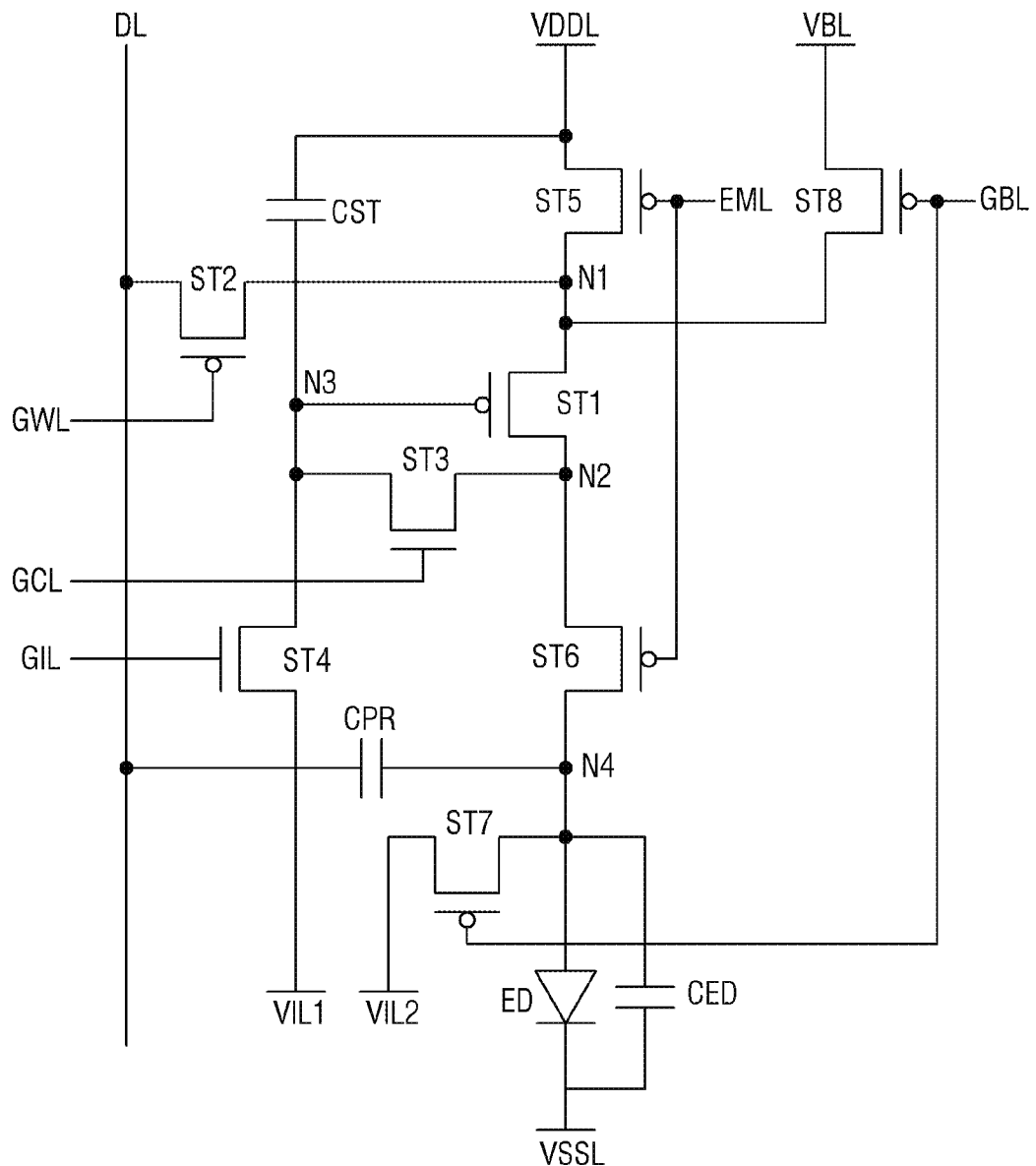
FIG. 5 is a circuit diagram illustrating a pixel of a display device according to an embodiment.
Figure 6:
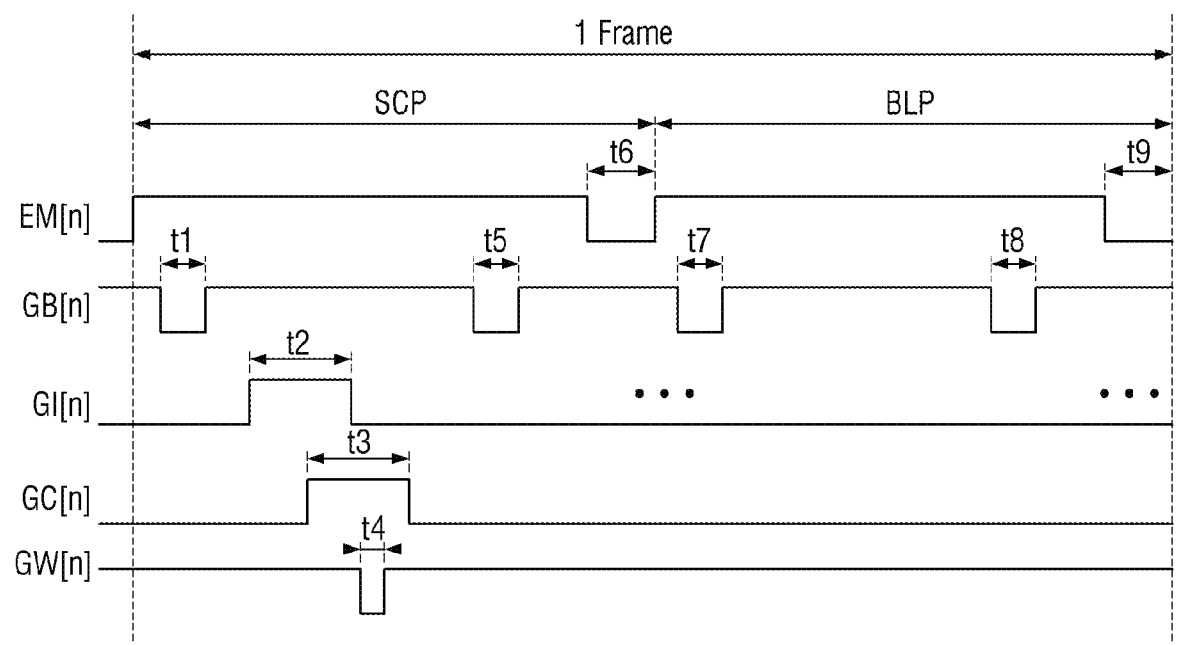
FIG. 6 is a waveform diagram of signals supplied to the pixel shown in FIG. 5.

FIG. 5 is a circuit diagram illustrating a pixel of a display device according to an embodiment. FIG. 6 is a waveform diagram of signals supplied to the pixel shown in FIG. 5.

Referring to FIGS. 4, 5 and 6, an embodiment of the display panel 300 may include a plurality of pixels arranged along p rows (here, p is a natural number) and q columns (here, q is a natural number). Each of the pixels SP may be connected to a first gate line GWL, a second gate line GCL, a third gate line GIL, a fourth gate line GBL, an emission control line EML, a data line DL, a driving voltage line VDDL, a first initialization voltage line VIL1, a second initialization voltage line VIL2, and a bias voltage line VBL.

Each of the pixel SP may include a pixel circuit and a light emitting element ED. The pixel circuit may include first to eighth transistors ST1, ST2, ST3, ST4, ST5, ST6, ST7, and ST8, a storage capacitor CST, a coupling capacitor CPR, and a parasitic capacitor CED.

The first transistor ST1 may include a gate electrode, a source electrode, and a drain electrode. The first transistor ST1 may control a source-drain current (Isd) (hereinafter, referred to as "driving current") according to the data voltage applied to the gate electrode. The driving current (Isd) flowing through the channel of the first transistor ST1 may be proportional to the square of a difference between a threshold voltage (Vth) and a voltage (Vsg) between the source electrode and the gate electrode of the first transistor ST1 (i.e., Isd=k×(Vsg−Vth)$^2$). Here, Isd denotes the driving current, k denotes a proportional coefficient determined by the structure and physical characteristics of the first transistor ST1, Vsg denotes a source-gate voltage of the first transistor ST1, and Vth denotes a threshold voltage of the first transistor ST1.

The light emitting element ED may emit light by receiving the driving current. The emission amount or the luminance of the light emitting element ED may be proportional to the magnitude of the driving current.

In an embodiment, the light emitting element ED may be an organic light emitting diode including a first electrode, a second electrode, and an organic light emitting layer disposed between the first electrode and the second electrode. Alternatively, the light emitting element ED may be an inorganic light emitting element including a first electrode, a second electrode, and an inorganic semiconductor disposed between the first electrode and the second electrode. Alternatively, the light emitting element ED may be a quantum dot light emitting element including a first electrode, a second electrode, and a quantum dot light emitting layer disposed between the first electrode and the second electrode. Alternatively, the light emitting element ED may be a micro light emitting diode.

The first electrode of the light emitting element ED may be connected to a fourth node N4. The first electrode of the light emitting element ED may be connected to the drain electrode of the seventh transistor ST7, and the drain electrode of the sixth transistor ST6 and the second electrode of the coupling capacitor CPR via the fourth node N4. The second electrode of the light emitting element ED may be connected to a low potential line VSSL. The parasitic capacitor CED may be connected between the first electrode and the second electrode of the light emitting element ED.

The second transistor ST2 may be turned on by a first gate signal GW[n] of the first gate line GWL to connect the data line DL with a first node N1 that is the source electrode of the first transistor ST1. That is, the second transistor ST2 may be turned on in response to the first gate signal GW[n] to supply the data voltage to the first node N1. The gate electrode of the second transistor ST2 may be connected to the first gate line GWL, the source electrode of the second transistor ST2 may be connected to the data line DL, and the drain electrode of the second transistor ST2 may be connected to the first node N1.

The third transistor ST3 may be turned on by a second gate signal GC[n] of the second gate line GCL to connect the second node N2, which is connected to the drain electrode of the first transistor ST1, to the third node N3, which is connected to the gate electrode of the first transistor ST1. The gate electrode of the third transistor ST3 may be connected to the second gate line GCL, the drain electrode of the third transistor ST3 may be connected to the second node N2, and the source electrode of the third transistor ST3 may be connected to the third node N3.

The fourth transistor ST4 may be turned on by the third gate signal GI[n] of the third gate line GIL to connect the first initialization voltage line VIL to the third node N3, which is connected to the gate electrode of the first transistor ST1. The fourth transistor ST4 may be turned on in response to the third gate signal GI[n], thereby discharging the gate electrode of the first transistor ST1 to a first initialization voltage. The gate electrode of the fourth transistor ST4 may be connected to the third gate line GIL, the drain electrode of the fourth transistor ST4 may be connected to the first initialization voltage line VIL1, and the source electrode of the fourth transistor ST4 may be connected to the third node N3.

The fifth transistor ST5 may be turned on by the emission signal of the emission control line EML to connect the driving voltage line VDDL to the first node N1, which is connected to the source electrode of the first transistor ST1. The gate electrode of the fifth transistor ST5 may be connected to the emission control line EML, the source electrode of the fifth transistor ST5 may be connected to the driving voltage line VDDL, and the drain electrode of the fifth transistor ST5 may be connected to the first node N1.

The sixth transistor ST6 may be turned on by the emission signal of the emission control line EML to connect the second node N2, which is connected to the drain electrode of the first transistor ST1, to the fourth node N4, which is connected to the first electrode of the light emitting element ED. The gate electrode of the sixth transistor ST6 may be connected to the emission control line EML, the source electrode of the sixth transistor ST6 may be connected to the second node N2, and the drain electrode of the sixth transistor ST6 may be connected to the fourth node N4.

When all of the fifth transistor ST5, the first transistor ST1, and the sixth transistor ST6 are turned on, the driving current may be supplied to the light emitting element ED.

The seventh transistor ST7 may be turned on by a fourth gate signal GB[n] of the fourth gate line GBL to connect the second initialization voltage line VIL2 to the fourth node N4 which is connected to the first electrode of the light emitting element ED. The seventh transistor ST7 may be turned on in response to the fourth gate signal GB[n], thereby discharging the first electrode of the light emitting element ED to a second initialization voltage. The gate electrode of the seventh transistor ST7 may be connected to the fourth gate line GBL, the source electrode of the seventh transistor ST7 may be connected to the second initialization voltage line VIL2, and the drain electrode of the seventh transistor ST7 may be connected to the fourth node N4.

The eighth transistor ST8 may be turned on by the fourth gate signal GB[n] of the fourth gate line GBL to connect the bias voltage line VBL with the first node N1 that is the source electrode of the first transistor ST1. The eighth transistor ST8 may be turned on in response to the fourth gate signal GB[n], thereby supplying a bias voltage to the first node N1. The eighth transistor ST8 may improve hysteresis of the first transistor ST1 by supplying the bias voltage to the source electrode of the first transistor ST1. The gate electrode of the eighth transistor ST8 may be connected to the fourth gate line GBL, the source electrode of the eighth transistor ST8 may be connected to the bias voltage line VBL, and the drain electrode of the eighth transistor ST8 may be connected to the first node N1.

Each of the first transistor ST1, the second transistor ST2, the fifth transistor ST5, the sixth transistor ST6, the seventh transistor ST7, and the eighth transistor ST8 may include a silicon-based active layer. In one embodiment, for example, each of the first, second, fifth, sixth, seventh, and eighth transistors ST1, ST2, ST5, ST6, ST7, and ST8 may include an active layer including or made of a low temperature polycrystalline silicon ("LTPS"). The active layer including or made of the LTSP may have high electron mobility and high turn-on characteristics. In such an embodiment, where the display device 10 includes the first, second, fifth, sixth, seventh, and eighth transistors ST1, ST2, ST5, ST6, ST7, and ST8 having high turn-on characteristics, the pixels may be driven in a stable and efficient manner.

Each of the first, second, fifth, sixth, seventh, and eighth transistors ST1, ST2, ST5, ST6, ST7, and ST8 may correspond to a p-type transistor. In one embodiment, for example, each of the first, second, fifth, sixth, seventh, and eighth transistors ST1, ST2, ST5, ST6, ST7, and ST8 may output a current flowing into the source electrode thereof to the drain electrode thereof based on a gate low voltage applied to the gate electrode thereof.

Each of the third transistor ST3 and the fourth transistor ST4 may include an oxide-based active layer. In one embodiment, for example, each of the third and fourth transistors ST3 and ST4 may have a coplanar structure in which the gate electrode is disposed on the oxide-based active layer. The transistor having a coplanar structure may have high off current characteristics and perform low frequency driving, thereby reducing power consumption. Accordingly, in such an embodiment, the display device 10 may include the third and fourth transistors ST3 and ST4 having high off current characteristics, thereby preventing a leakage current from flowing in the pixel, and stably maintaining the voltage in the pixel.

Each of the third transistor ST3 and the fourth transistor ST4 may correspond to an n-type transistor. In one embodiment, for example, each of the third and fourth transistors ST3 and ST4 may output a current flowing into the drain electrode thereof to the source electrode thereof based on a gate high voltage applied to the gate electrode thereof.

The storage capacitor CST may be connected between the third node N3, which is connected to the gate electrode of the first transistor ST1, and the driving voltage line VDDL. In one embodiment, for example, a first electrode of the storage capacitor CST may be connected to the third node N3, and a second electrode of the storage capacitor CST may be connected to the driving voltage line VDDL, thereby maintaining a potential difference between the driving voltage line VDDL and the gate electrode of the first transistor ST1.

The coupling capacitor CPR may be connected between the data line DL and the fourth node N4. In one embodiment, for example, a first electrode of the coupling capacitor CPR may be connected to the data line DL, and a second electrode of the coupling capacitor CPR may be connected to the fourth node N4 that is the first electrode of the light emitting element ED. The coupling capacitor CPR may store a difference voltage between the data line DL and the first electrode of the light emitting element ED, so that the first electrode of the light emitting element ED may be affected by coupling corresponding to a change in the data voltage of the data line DL.

In one embodiment, for example, the coupling capacitor CPR may increase the voltage of the fourth node N4 when the data voltage of the data line DL rapidly increases. In such an embodiment, the coupling capacitor CPR may decrease the voltage of the fourth node N4 when the data voltage of the data line DL rapidly decreases. Accordingly, the coupling capacitor CPR may change the voltage of the fourth node N4 in synchronization with a rising edge or a falling edge of the data voltage.

Referring to FIG. 6 in conjunction with FIG. 5, when the display device 10 is driven at a predetermined driving frequency, one frame period 1Frame may include a scanning period SCP and a blanking period BLP. In an embodiment, as shown in FIG. 6, the scanning period SCP may include first to sixth periods t1 to t6, and the blanking period BLP may include seventh to ninth periods t7 to t9.

The seventh transistor ST7 may receive the fourth gate signal GB[n] of a low level during the first period t1. The seventh transistor ST7 may be turned on based on the fourth gate signal GB[n] of a low level to supply the second initialization voltage to the fourth node N4 that is the first electrode of the light emitting element ED. Accordingly, the seventh transistor ST7 may initialize the first electrode of the light emitting element ED during the first period t1.

The eighth transistor ST8 may receive the fourth gate signal GB[n] of a low level during the first period t1. The eighth transistor ST8 may be turned on based on the fourth gate signal GB[n] of a low level to supply the bias voltage to the first node N1 that is the source electrode of the first transistor ST1. In one embodiment, for example, the first period t1 may correspond to a pre-bias period. Accordingly, the eighth transistor ST8 may set an operating point or an operating condition of the first transistor ST1.

The fourth transistor ST4 may receive the third gate signal GI[n] of a high level during the second period t2. The fourth transistor ST4 may be turned on based on the third gate signal GI[n] of a high level to supply the first initialization voltage to the third node N3, which is connected to the gate electrode of the first transistor ST1. Accordingly, the fourth transistor ST4 may initialize the gate electrode of the first transistor ST1 during the second period t2.

The third transistor ST3 may receive the second gate signal GC[n] of a high level during the third period t3. The third transistor ST3 may be turned on based on the second gate signal GC[n] of a high level, and may connect the second node N2 to the third node N3.

The second transistor ST2 may receive the first gate signal GW[n] of a low level during the fourth period t4. The second transistor ST2 may be turned on based on the first gate signal GW[n] of a low level to supply a data voltage VDATA to the first node N1 that is the source electrode of the first transistor ST1.

When the source electrode of the first transistor ST1 receives the data voltage (VDATA), a source-gate voltage (Vsg) of the first transistor ST1 may correspond to a difference voltage (VDATA-VI1) between the data voltage (VDATA) and the first initialization voltage (VI1), and the first transistor ST1 may be turned on because the source-gate voltage (Vsg) of the first transistor ST1 is greater than the threshold voltage (Vth) (i.e., VDATA-VI1>=Vth). Accordingly, at the moment when the second transistor ST2 is turned on in the fourth period t4, the source-drain current (Isd) of the first transistor ST1 may be determined based on the data voltage VDATA, the first initialization voltage VI1, and the threshold voltage Vth of the first transistor ST1 (i.e., $Isd=k \times (VDATA-VI1-Vth)^2$). The first transistor ST1 may supply the source-drain current (Isd) to the second node N2 until the source-gate voltage (Vsg) reaches the threshold voltage Vth of the first transistor ST1. Further, the third transistor ST3 may be turned on for the third period t3 to supply the voltage of the second node N2 to the third node N3. In this manner, while the first transistor ST1 is turned on, the voltage of the third node N3 and the source-drain current (Isd) of the first transistor ST1 may be changed, and the voltage of the third node N3 may eventually converge to a difference voltage (Vdata-Vth) between the data voltage (VDATA) and the threshold voltage (Vth) of the first transistor ST1.

The eighth transistor ST8 may receive the fourth gate signal GB[n] of a low level during the fifth period t5. The eighth transistor ST8 may be turned on based on the fourth gate signal GB[n] of a low level to supply a bias voltage to the first node N1 that is the source electrode of the first transistor ST1. In one embodiment, for example, the fifth period t5 may correspond to a post-bias period. Accordingly, the eighth transistor ST8 may be turned on during the first period (or pre-bias period) and the fifth period (or post-bias period) of the scanning period SCP, thereby preventing the change in the characteristics of the first transistor ST1 due to a bias stress and improving hysteresis thereof.

An emission signal EM[n] may have a gate low voltage during the sixth period t6. When the emission signal EM[n] has a low level, the fifth and sixth transistors ST5 and ST6 may be turned on to supply a driving current to the light emitting element ED.

The fourth gate signal GB[n] may have a gate low voltage during the seventh and eighth periods t7 and t8 of the blanking period BLP. Accordingly, the seventh transistor ST7 may supply the second initialization voltage to the fourth node N4 that is the first electrode of the light emitting element ED even in the blanking period BLP to initialize the first electrode of the light emitting element ED. The eighth transistor ST8 may supply the bias voltage to the first node N1 that is the source electrode of the first transistor ST1 even in the blanking period BLP, thereby improving the hysteresis of the first transistor ST1.

Figure 7:
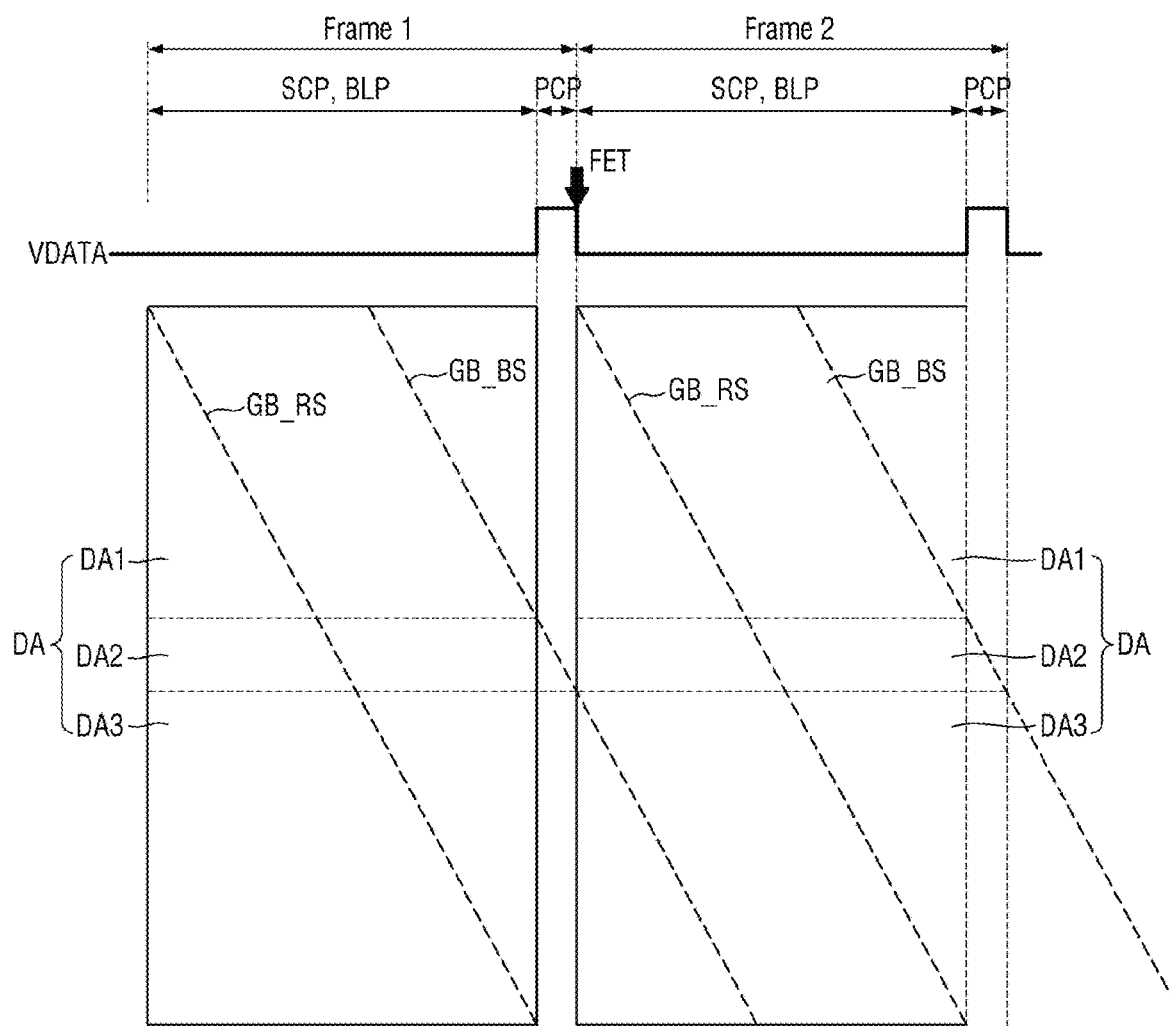
FIG. 7 is a diagram illustrating a method of driving a display device according to an embodiment.
Figure 8:
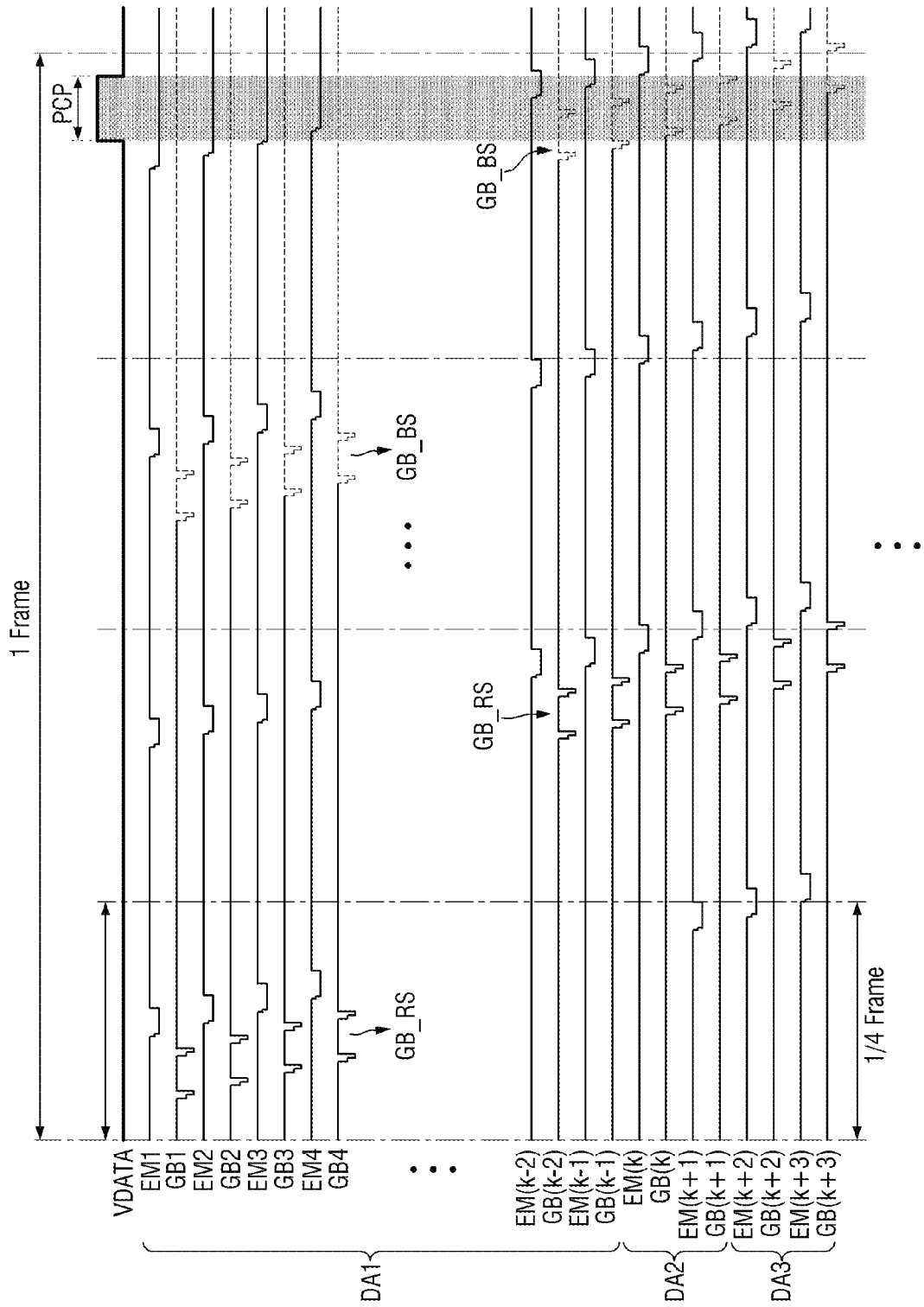
FIG. 8 is a waveform diagram of signals supplied to a pixel during one frame in a display device according to an embodiment.

FIG. 7 is a diagram illustrating a method of driving a display device according to an embodiment. FIG. 8 is a waveform diagram of signals supplied to a pixel during one frame in a display device according to an embodiment.

Referring to FIGS. 7 and 8, in an embodiment, the pixels SP may be driven with a predetermined driving frequency. The pixels may display images that change relatively rapidly in a high-speed driving mode, and may display images that change relatively slowly in a low-speed driving mode. Here, the high-speed driving mode and the low-speed driving mode are relative, and the driving frequency of each of the high-speed driving mode and the low-speed driving mode is not limited to a specific value.

Each of the first and second frame periods Frame1 and Frame2 may include the scanning period SCP, the blanking period BLP, and a porch period PCP. The porch period PCP may be between the first and second frame periods Frame1 and Frame2.

The display device 10 may supply the first gate signal GW[n], the second gate signal GC[n], and the third gate signal GI[n] to the pixels SP based on the predetermined driving frequency. In an embodiment, the driving frequency may be 120 hertz (Hz), but is not limited thereto. Each of the first to third gate signals GW[n], GC[n], and GI[n] may have a gate-on voltage once during the one frame period 1Frame.

In an embodiment, as shown in FIG. 6, the fourth gate signal GB[n] may have a gate-on voltage multiple times during the one frame period 1Frame. The fourth gate signal GB[n] may have the gate-on voltage in each of the scanning period SCP and the blanking period BLP of the one frame period 1Frame. In one embodiment, for example, the fourth gate signal GB[n] supplied in the scanning period SCP may correspond to a real scan signal GB_RS. In such an embodiment, the fourth gate signal GB[n] supplied in the blanking period BLP may correspond to a blank scan signal GB_BS. Referring to FIGS. 6 to 8, the fourth gate signal GB[n] supplied during each of the first and fifth periods t1 and t5 may correspond to the real scan signal GB_RS. The fourth gate signal GB[n] supplied during each of the seventh and eighth periods t7 and t8 may correspond to the blank scan signal GB_BS.

The display area DA may include first to third display areas DA1, DA2, and DA3. The first display area DA1 may be arranged at an upper side of the display area DA, the third display area DA3 may be arranged at a lower side of the display area DA, and the second display area DA2 may be arranged between the first and third display areas DA1 and DA3. In one embodiment, for example, the first display areas DA1 may receive first to (k−1)-th emission signals EM1 to EM(k−1) and first to (k−1)-th fourth gate signal GB1 to GB(k−1), the second display area DA2 may receive k-th to (k+1)-th emission signals EM(k) to EM(k+1) and k-th to (k+1)-th fourth gate signal GB(k) to GB(k+1), and the third display area DA3 may receive (k+2)-th to n-th emission signals EM(k+2) to EM(n) and (k+2)-th to n-th fourth gate signal GB(k) to GB(n).

The real scan signals GB_RS may be sequentially supplied to the top of the first display area DA1 through the bottom of the third display area DA3 during the first frame period Frame1. The blank scan signals GB_BS may be sequentially supplied to the top of the first display area DA1 through the bottom of the third display area DA3 after a predetermined time delay after the real scan signal GB_RS. In this case, the blank scan signal GB_BS may be supplied to the first display area DA1 during the first frame period Frame1, supplied to the second display area DA2 during the porch period PCP, and supplied to the third display area DA3 during the second frame period Frame2.

The data voltage VDATA may be supplied to the pixels SP during the scanning period SCP to determine the luminance of the pixels SP. The data voltage VDATA may have a black data voltage during the porch period PCP. The data voltage VDATA may increase rapidly at the start of the porch period PCP, and may decrease rapidly at the end of the porch period PCP. The coupling capacitor CPR illustrated in FIG. 5 may change the voltage of the fourth node N4 in synchronization with the rising edge or the falling edge of the data voltage VDATA. The blank scan signal GB_BS may be supplied to the second display area DA2 during the porch period PCP. Accordingly, the fourth node N4 of each of the pixels SP arranged in the second display area DA2 may have a voltage lower than the second initialization voltage in synchronization with a falling time FET of the data voltage VDATA.

Figure 9:
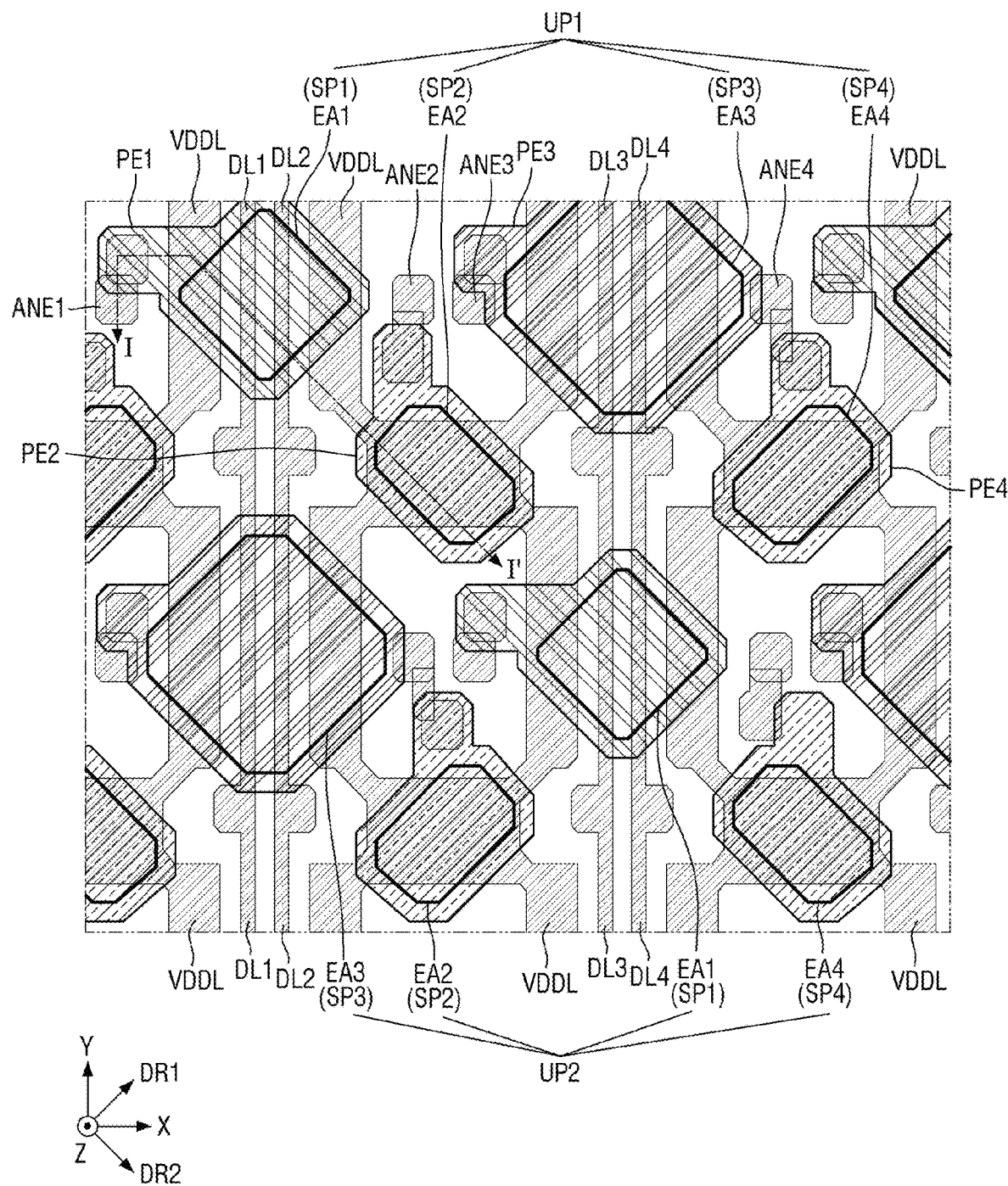
FIG. 9 is a plan view illustrating a plurality of unit pixels in a display device according to an embodiment.
Figure 10:
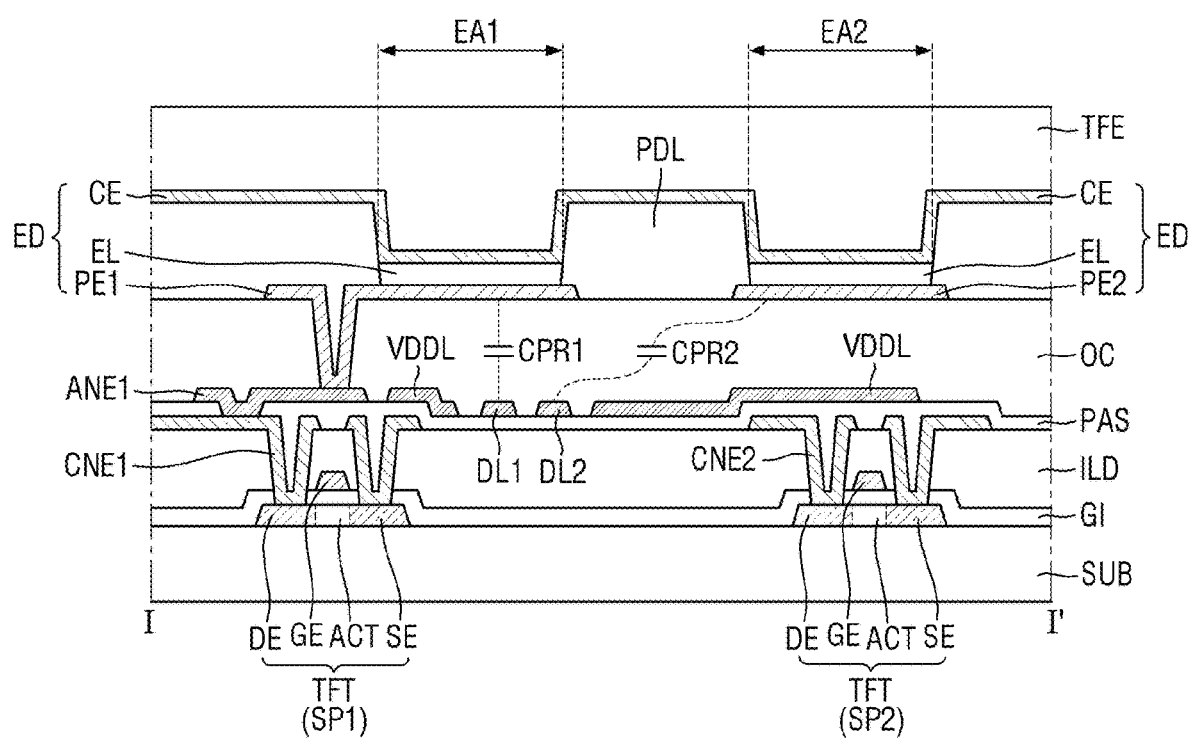
FIG. 10 is a cross-sectional view taken along line I-I' of FIG. 9.

FIG. 9 is a plan view illustrating a plurality of unit pixels in a display device according to an embodiment. FIG. 10 is a cross-sectional view taken along line I-I' of FIG. 9.

Referring to FIGS. 9 and 10, an embodiment of the display area DA may include a plurality of unit pixels. The unit pixels may include first and second unit pixels UP1 and UP2. Each of the first and second unit pixels UP1 and UP2 may include first to fourth pixels SP1, SP2, SP3, and SP4. The first pixel SP1 may be a red pixel including the light emitting element ED that outputs red light. The second pixel SP2 may be a green pixel including the light emitting element ED that outputs green light. The third pixel SP3 may be a blue pixel including the light emitting element ED that outputs blue light. The fourth pixel SP4 may be a green pixel including the light emitting element ED that outputs green light. Accordingly, each of the first and second unit pixels UP1 and UP2 may include one red pixel, two green pixels, and one blue pixel. Each of the first to fourth pixels SP1 to SP4 may include the pixel circuit shown in FIG. 5, but is not limited thereto.

The first pixel SP1 may include a first pixel circuit, a first anode connection electrode ANE1, a first pixel electrode PE1, and a first opening area EA1. The first pixel electrode PE1 may be connected to the first pixel circuit through the first anode connection electrode ANE1.

The second pixel SP2 may include a second pixel circuit, a second anode connection electrode ANE2, a second pixel electrode PE2, and a second opening area EA2. The second pixel electrode PE2 may be connected to the second pixel circuit through the second anode connection electrode ANE2.

The third pixel SP3 may include a third pixel circuit, a third anode connection electrode ANE3, a third pixel electrode PE3, and a third opening area EA3. The third pixel electrode PE3 may be connected to the third pixel circuit through the third anode connection electrode ANE3.

The fourth pixel SP4 may include a fourth pixel circuit, a fourth anode connection electrode ANE4, a fourth pixel electrode PE4, and a fourth opening area EA4. The fourth pixel electrode PE4 may be connected to the fourth pixel circuit through the fourth anode connection electrode ANE4.

In such an embodiment, each of the first to fourth pixel electrodes PE1 to PE4 may be the first electrode of the light emitting element ED shown in FIG. 5. The first to fourth pixel electrodes PE1 to PE4 may be exposed by the first to fourth opening areas EA1 to EA4, respectively. The first to fourth opening areas EA1 to EA4 may be defined by a pixel defining layer. A light emitting layer of each of the first to fourth pixels SP1 to SP4 may be disposed in each of the first to fourth opening areas EA1 to EA4 to emit light of a specific wavelength band. The size (or a planer area) of each of the first to fourth opening areas EA1 to EA4 may be adjusted to realize white light by mixing lights emitted from the respective light emitting layers. The first to fourth opening areas EA1 to EA4 may have different sizes from each other to realize white light. In one embodiment, for example, the size of the first opening area EA1 may be larger than the size of the second opening area EA2, and the size of the third opening area EA3 may be larger than the size of the first opening area EA1. The size of the second opening area EA2 may be the same as the size of the fourth opening area EA4.

The sizes of the first to fourth opening areas EA1 to EA4 may correspond to the sizes of the first to fourth pixel electrodes PE1 to PE4, respectively. Accordingly, the size of the first pixel electrode PE1 may be larger than the size of the second pixel electrode PE2, and the size of the third pixel electrode PE3 may be larger than the size of the first pixel electrode PE1. The size of the second pixel electrode PE2 may be the same as the size of the fourth pixel electrode PE4.

The first and third opening areas EA1 and EA3 may be alternately disposed with each other along the X-axis direction or the Y-axis direction. In one embodiment, for example, the third opening area EA3 of the first unit pixel UP1 may be disposed in the X-axis direction from the first opening area EA1 of the first unit pixel UP1. In such an embodiment, the third opening area EA3 of the second unit pixel UP2 may be disposed in the Y-axis direction from the first opening area EA1 of the first unit pixel UP1.

The second opening area EA2 may be disposed in a second direction DR2 from the first opening area EA1 or in a first direction DR1 from the third opening area EA3. In such an embodiment, the first direction DR1 may be an oblique direction with respect to the X-axis direction and the Y-axis direction, and the second direction DR2 may be an oblique direction with respect to the X-axis direction and an opposite direction to the Y-axis direction. In one embodiment, for example, the second opening area EA2 of the first unit pixel UP1 may be disposed in the second direction DR2 from the first opening area EA1 of the first unit pixel UP1. The second opening area EA2 of the second unit pixel UP2 may be disposed in the second direction DR2 from the third opening area EA3 of the second unit pixel UP2.

The second and fourth opening areas EA2 and EA4 may be alternately disposed with each other along the X-axis direction or the Y-axis direction. In one embodiment, for example, the fourth opening area EA4 of the first unit pixel UP1 may be disposed in the X-axis direction from the second opening area EA2 of the first unit pixel UP1. In such an embodiment, the second opening area EA2 of the second unit pixel UP2 may be disposed in the Y-axis direction from the second opening area EA2 of the first unit pixel UP1.

The first and second data lines DL1 and DL2 may be disposed adjacent to each other and may extend in the Y-axis direction. In such an embodiment, the first data line DL1 may be connected to the first pixel circuit of the first pixel SP1 of the first unit pixel UP1 and the third pixel circuit of the third pixel SP3 of the second unit pixel UP2. The second data line DL2 may be connected to the second pixel circuit of the second pixel SP2 of the first unit pixel UP1 and the second pixel circuit of the second pixel SP2 of the second unit pixel UP2. The first and second data lines DL1 and DL2 may overlap the first pixel electrode PE1 of the first unit pixel UP1 and the third pixel electrode PE3 of the second unit pixel UP2 in the thickness direction (Z-axis direction). The first and second data lines DL1 and DL2 may overlap a center portion of the first opening area EA1 of the first unit pixel UP1 and a center portion of the third opening area EA3 of the second unit pixel UP2 in the thickness direction (Z-axis direction).

In an embodiment, as shown in FIG. 10, a first coupling capacitor CPR1 may be formed or defined between the first pixel electrode PE1 of the first unit pixel UP1 and the first data line DL1. The first pixel electrode PE1 of the first unit pixel UP1 may be a relatively short distance away from the first data line DL1, and the capacitance of the first coupling capacitor CPR1 may be relatively great. Accordingly, the first pixel electrode PE1 of the first unit pixel UP1 may be affected by coupling corresponding to the change in the data voltage VDATA of the first data line DL1, and the third pixel electrode PE3 of the second unit pixel UP2 may be affected by coupling corresponding to the change in the data voltage VDATA of the first data line DL1.

The first and second data lines DL1 and DL2 may be spaced apart from the second pixel electrode PE2 of the first unit pixel UP1 and the second pixel electrode PE2 of the second unit pixel UP2 in the plan view. A second coupling capacitor CPR2 may be formed or defined between the second pixel electrode PE2 of the first unit pixel UP1 and the second data line DL2. The second pixel electrode PE2 of the first unit pixel UP1 may be a relatively long distance away from the second data line DL2, and the capacitance of the second coupling capacitor CPR2 may be relatively small. Accordingly, even if the data voltage VDATA of the second data line DL2 changes, the second pixel electrode PE2 of the first unit pixel UP1 may not be affected by coupling to the change in the data voltage VDATA of the second data line DL2.

In an embodiment, the first pixel SP1 may output red light, the second and fourth pixels SP2 and SP4 may output green light, and the third pixel SP3 may output blue light. In such an embodiment, the user may recognize the change in green light more sensitively than the change in red or blue light. Accordingly, the first pixel SP1 outputs red light, so that the user may visually recognize a relatively small voltage change in the first pixel electrode PE1 due to the coupling capacitor CPR. In such an embodiment, since the third pixel SP3 outputs blue light, the user may visually recognize a relatively small voltage change in the third pixel electrode PE3 due to the coupling capacitor CPR. In such an embodiment, since the second and fourth pixels SP2 and SP4 are not affected by coupling, voltage changes of the second and fourth pixel electrodes PE2 and PE4 may hardly occur. Accordingly, in such an embodiment of the display device 10, even when the blank scan signal GB_BS is supplied to the second display area DA2 during the porch period PCP, stains may be effectively prevented from being visually recognized in the second display area DA2.

In an embodiment, the third and fourth data lines DL3 and DL4 may be disposed adjacent to each other and may extend in the Y-axis direction. The third and fourth data lines DL3 and DL4 may be spaced apart from the first and second data lines DL1 and DL2 with the driving voltage line VDDL interposed therebetween. In such an embodiment, the third data line DL3 may be connected to the third pixel circuit of the third pixel SP3 of the first unit pixel UP1 and the first pixel circuit of the first pixel SP1 of the second unit pixel UP2. The fourth data line DL4 may be connected to the fourth pixel circuit of the fourth pixel SP4 of the first unit pixel UP1 and the fourth pixel circuit of the fourth pixel SP4 of the second unit pixel UP2. The third and fourth data lines DL3 and DL4 may overlap the third pixel electrode PE3 of the first unit pixel UP1 and the first pixel electrode PE1 of the second unit pixel UP2 in the thickness direction (Z-axis direction). The third and fourth data lines DL3 and DL4 may overlap a center portion of the third opening area EA3 of the first unit pixel UP1 and a center portion of the first opening area EA1 of the second unit pixel UP2 in the thickness direction (Z-axis direction). The third and fourth data lines DL3 and DL4 may be spaced apart from the fourth pixel electrode PE4 of the first unit pixel UP1 and the fourth pixel electrode PE4 of the second unit pixel UP2 in the plan view.

The driving voltage line VDDL may be disposed between the second and third data lines DL2 and DL3. The driving voltage lines VDDL may extend in the Y-axis direction and may be spaced apart from each other in the X-axis direction. The driving voltage line VDDL may overlap the second opening area EA2 and the fourth opening area EA4 in the thickness direction (Z-axis direction). In one embodiment, for example, the driving voltage line VDDL may overlap the centers of the second and fourth opening areas EA2 and EA4 in the thickness direction (Z-axis direction). The driving voltage line VDDL may be spaced apart from the center portion of the first opening area EA1 or the center portion of the third opening area EA3 in the plan view. An opening may be defined through the driving voltage line VDDL between the second opening areas EA2 or between the fourth opening areas EA4 in the plan view.

FIG. 10 illustrates an embodiment of the display panel 300 including a substrate SUB, a thin film transistor TFT, a gate insulating layer GI, an interlayer insulating layer ILD, first and second connection electrodes CNE1 and CNE2, a passivation layer PAS, the first and second data lines DL1 and DL2, the driving voltage line VDDL, the first anode connection electrode ANE1, a planarization layer OC, the light emitting element ED, a pixel defining layer PDL, and an encapsulation layer TFE.

The substrate SUB may be a base substrate or a base member, and may include or be made of an insulating material such as a polymer resin. The substrate SUB may be a flexible substrate which may be bendable, foldable or rollable. In one embodiment, for example, the substrate SUB may include a glass material or a metal material, but is not limited thereto. For another example, the substrate SUB may include polyimide ("PI").

The thin film transistor TFT may be disposed on the substrate SUB, and may constitute a pixel circuit of each of the pixels SP. In one embodiment, for example, the thin film transistor TFT may be a transistor of the pixel circuit. The thin film transistor TFT may include a semiconductor region ACT, a source electrode SE, a drain electrode DE, and a gate electrode GE.

The semiconductor region ACT, the source electrode SE, and the drain electrode DE may be disposed on the substrate SUB. The semiconductor region ACT may overlap the gate electrode GE in the thickness direction, and may be insulated from the gate electrode GE by the gate insulating layer GI. The source electrode SE and the drain electrode DE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be disposed on the semiconductor region ACT, the source electrode SE, and the drain electrode DE. In one embodiment, for example, the gate insulating layer GI may cover the semiconductor region ACT, the source electrode SE, the drain electrode DE, and the substrate SUB, and may insulate the semiconductor region ACT from the gate electrode GE. A contact hole may be defined through the gate insulating layer GI, and the first and second connection electrodes CNE1 and CNE2 may be disposed in or through the contact hole of the gate insulating layer GI.

The interlayer insulating layer ILD may cover the gate electrode GE and the gate insulating layer GI. A contact hole may be defined through the interlayer insulating layer ILD, and the first and second connection electrodes CNE1 and CNE2 may be disposed in or through the contact hole of the interlayer insulating layer ILD. The contact hole of the interlayer insulating layer ILD may be connected to the contact hole of the gate insulating layer GI.

The first connection electrode CNE1 may be disposed on the interlayer insulating layer ILD. The first connection electrode CNE1 may connect the first anode connection electrode ANE1 to the drain electrode DE of the thin film transistor TFT of the first pixel SP1. The first connection electrode CNE1 may be inserted into the contact holes defined through the interlayer insulating layer ILD and the gate insulating layer GI to be in contact with the drain electrode DE of the thin film transistor TFT of the first pixel SP1.

The second connection electrode CNE2 may be disposed to be spaced apart from the first connection electrode CNE1 on the interlayer insulating layer ILD. The second connection electrode CNE2 may connect the second anode connection electrode ANE2 to the drain electrode DE of the thin film transistor TFT of the second pixel SP2. The second connection electrode CNE2 may be inserted into the contact holes defined through the interlayer insulating layer ILD and the gate insulating layer GI to be in contact with the drain electrode DE of the thin film transistor TFT of the second pixel SP2.

The passivation layer PAS may cover the first and second connection electrodes CNE1 and CNE2, and the interlayer insulating layer ILD. The passivation layer PAS may protect the thin film transistor TFT. A contact hole may be defined through the passivation layer PAS, and the first anode connection electrode ANE1 may be disposed in the contact hole of the passivation layer PAS.

The first anode connection electrode ANE1 may be disposed on the passivation layer PAS. The first anode connection electrode ANE1 may connect the first connection electrode CNE1 to the first pixel electrode PE1 of the light emitting element ED of the first pixel SP1. The first anode connection electrode ANE1 may be inserted into the contact hole of the passivation layer PAS to be in contact with the first connection electrode CNE1.

The first and second data lines DL1 and DL2 may be disposed in or directly on a same layer as the first anode connection electrode ANE1. The first and second data lines DL1 and DL2 may overlap the first pixel electrode PE1 in the thickness direction (Z-axis direction), and may not overlap the second pixel electrode PE2 in the thickness direction (Z-axis direction). The first and second data lines DL1 and DL2 may be spaced apart from the second pixel electrode PE2 in the plan view. The first coupling capacitor CPR1 may be formed or defined between the first pixel electrode PE1 and the first data line DL1. The second coupling capacitor CPR2 may be formed or defined between the second pixel electrode PE2 and the second data line DL2. The capacitance of the first coupling capacitor CPR1 may be greater than the capacitance of the second coupling capacitor CPR2. Accordingly, the first pixel electrode PE1 may be affected by coupling corresponding to the change in the data voltage VDATA of the first data line DL1, but the second pixel electrode PE2 may not be affected by coupling even when the data voltage VDATA of the second data line DL2 changes.

The driving voltage line VDDL may be disposed in or directly on a same layer as the first anode connection electrode ANE1 and the first and second data lines DL1 and DL2. The driving voltage line VDDL may overlap the second pixel electrode PE2 in the thickness direction (Z-axis direction). The driving voltage line VDDL may overlap a part of the first pixel electrode PE1 except the center portion of the first pixel electrode PE1, in the thickness direction (Z-axis direction).

The planarization layer OC may cover the first anode connection electrode ANE1, the first and second data lines DL1 and DL2, the driving voltage line VDDL, and the passivation layer PAS. The planarization layer OC may provide a planarized surface on the top of the thin film transistor TFT. In one embodiment, for example, a contact hole may be defined through the planarization layer OC, and the first pixel electrode PE1 of the light emitting element ED may be disposed in the contact hole of the planarization layer OC. In such an embodiment, the contact hole of the planarization layer OC may be connected to the contact hole of the protection layer PAS. The planarization layer OC may include an organic material.

The light emitting element ED may be disposed on the planarization layer OC. The light emitting element ED of the first pixel SP1 may include the first pixel electrode PE1, a light emitting layer EL, and a common electrode CE. The light emitting element ED of the second pixel SP2 may include the second pixel electrode PE2, the light emitting layer EL, and the common electrode CE.

The first pixel electrode PE1 may be disposed on the planarization layer OC. The first pixel electrode PE1 may be disposed to overlap the first opening area EA1 among the opening areas defined by the pixel defining layer PDL. The first pixel electrode PE1 may be connected to the drain electrode DE of the thin film transistor TFT via the first anode connection electrode ANE1 and the first connection electrode CNE1.

The second pixel electrode PE2 may be disposed to be spaced apart from the first pixel electrode PE1 on the planarization layer OC. The second pixel electrode PE2 may be disposed to overlap the second opening area EA2 among the opening areas defined by the pixel defining layer PDL. The second pixel electrode PE2 may be connected to the drain electrode DE of the thin film transistor TFT via the second anode connection electrode ANE2 and the second connection electrode CNE2.

The light emitting layer EL may be disposed on the first pixel electrode PE1 or the second pixel electrode PE2. In one embodiment, for example, the light emitting layer EL may be an organic light emitting layer made of an organic material, but is not limited thereto. In an embodiment where the light emitting layer EL is the organic light emitting layer, when the thin film transistor TFT applies a predetermined voltage to the first or second pixel electrode PE1 or PE2, and the common electrode CE receives the common voltage or a cathode voltage, holes and electrons may move to the organic light emitting layer EL through a hole transporting layer and an electron transporting layer, respectively, and the holes and electrons may combine with each other in the organic light emitting layer EL to emit light.

The common electrode CE may be arranged on the light emitting layer EL. In one embodiment, for example, the common electrode CE may not be divided for each of the pixels SP, but may be formed as an electrode body common to all pixels SP. The common electrode CE may be disposed on the light emitting layer EL in the first to third opening areas EA1, EA2, and EA3, and may be disposed on the pixel defining layer PDL in an area other than the first to third light opening areas EA1, EA2, and EA3.

The common electrode CE may receive the common voltage or a low potential voltage. When the first or second pixel electrode PE1 or PE2 receives a voltage corresponding to the data voltage and the common electrode CE receives a low potential voltage, a potential difference may be formed between the common electrode CE and the first or second pixel electrode PE1 or PE2, so that the organic light emitting layer EL may emit light. Accordingly, the display device 10 may display an image.

The pixel defining layer PDL may define the first to fourth opening areas EA1 to EA4. The pixel defining layer PDL may separate and insulate the first to fourth pixel electrodes PE1 to PE4 from each other.

The encapsulation layer TFE may be disposed on the common electrode CE to cover the light emitting elements ED. The encapsulation layer TFE may include at least one inorganic layer to prevent oxygen or moisture from permeating into the light emitting elements ED. The encapsulation layer TFE may include at least one organic layer to protect the light emitting elements ED from foreign matters such as dust.

According to embodiments of the invention as described herein, pixel electrodes of some pixels may overlap a plurality of data lines, and pixel electrodes of other pixels may not overlap the plurality of data lines. In such embodiments, the capacitance between the data line and the pixel electrodes of some pixels may be relatively great, and the capacitance between the data line and the pixel electrodes of some other pixels may be relatively small. Therefore, the pixel electrodes of some pixels that output light of a first color may be affected by coupling according to a change in the data voltage, but the pixel electrodes of other pixels that output light of a second color may not be affected by coupling even when the data voltage changes. In such embodiments of the display device, stains due to such couplings may be effectively prevented from being visually recognized in a partial area of the display area.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a first data line extending in a first direction;
a second data line extending in the first direction and adjacent to the first data line;
a driving voltage line extending in the first direction and adjacent to the second data line;
a third data line extending in the first direction, wherein the driving voltage line is disposed between the second and third data lines;
a first pixel comprising a first pixel electrode connected to the first data line and overlapping the first and second data lines;
a second pixel comprising a second pixel electrode connected to the second data line and overlapping the driving voltage line;
a third pixel comprising a third pixel electrode connected to the third data line and overlapping the third data line,
wherein the driving voltage line comprises:
a first portion overlapping the second pixel electrode;
a second portion branched from the first portion and overlapping the first pixel electrode; and
a third portion branched from the first portion and overlapping the third pixel electrode, and
wherein a part of the second portion and a part of the third portion of the driving voltage line are parallel to each other.

2. The display device of claim 1, wherein
the first pixel emits red light,
the second pixel emits green light, and
the third pixel emits blue light.

3. The display device of claim 1, wherein
an area of the first pixel electrode is larger than an area of the second pixel electrode, and an area of the third pixel electrode is larger than the area of the first pixel electrode.

4. The display device of claim 1, wherein
the third pixel electrode is spaced apart from the first pixel electrode in a second direction perpendicular to the first direction, and
the second pixel electrode is spaced apart from the first pixel electrode in an oblique direction with respect to the first direction and the second direction.

5. The display device of claim 1, wherein
the first pixel electrode and the third pixel electrode are disposed in a same, and
the second pixel electrode is disposed in a different row from the first and third pixel electrodes.

6. The display device of claim 1, further comprising:
a first pixel circuit connected between the first data line and the first pixel electrode;
a second pixel circuit connected between the second data line and the second pixel electrode; and
a third pixel circuit connected between the third data line and the third pixel electrode.

7. The display device of claim 6, wherein
the second pixel electrode is disposed between the second data line and the third data line.

8. The display device of claim 7, wherein
the driving voltage line is disposed in a same layer as the first to third data lines.

9. The display device of claim 8, wherein
a center portion of the first pixel electrode and a center portion of the third pixel electrode are spaced apart from the driving voltage line in the plan view in the thickness direction.

10. The display device of claim 6, wherein the first pixel circuit comprises:
a first transistor which controls a driving current flowing through the first pixel electrode;
a second transistor which supplies a data voltage to a first node, which is connected to a source electrode of the first transistor;
a third transistor which connects a second node, which is connected to a drain electrode of the first transistor, to a third node, which is connected to a gate electrode of the first transistor; and
a first coupling capacitor connected between the first data line and a fourth node, which is connected to the first pixel electrode.

11. The display device of claim 10, wherein the second pixel circuit comprises:
a first transistor which controls a driving current flowing through the second pixel electrode;
a second transistor which supplies a data voltage to a first node, which is connected to a source electrode of the first transistor, based on a first gate signal;
a third transistor which connects a second node, which is connected to a drain electrode of the first transistor, to a third node, which is connected to a gate electrode of the first transistor, based on a second gate signal; and
a second coupling capacitor connected between the second data line and a fourth node which is connected to the second pixel electrode.

12. The display device of claim 11, wherein a capacitance of the first coupling capacitor is greater than a capacitance of the second coupling capacitor.

13. The display device of claim 10, wherein the first pixel circuit further comprises:
a fourth transistor which supplies a first initialization voltage to the third node based on a third gate signal;
a fifth transistor which supplies a driving voltage to the first node based on an emission signal;
a sixth transistor which connects the second node to the fourth node based on the emission signal; and
a seventh transistor which supplies a second initialization voltage to the fourth node based on a fourth gate signal.

14. The display device of claim 13, wherein the first pixel circuit further comprises an eighth transistor which supplies a bias voltage to the first node based on the fourth gate signal.

15. The display device of claim 13, wherein
each of the first transistor, the second transistor, the fifth transistor, the sixth transistor, and the seventh transistor corresponds to a transistor of a first type, and
each of the third transistor and the fourth transistor corresponds to a transistor of a second type different from the first type.

16. The display device of claim 13, wherein the first pixel circuit receives each of the first to third gate signals once during one frame period, and receives the fourth gate signal multiple times during the one frame period.

17. The display device of claim 13, wherein the first pixel circuit receives the first to third gate signals during a first period in one frame period, and receives the fourth gate signal during the first period and a second period other than the first period in the one frame period.

18. The display device of claim 6, further comprising:
a substrate;
a thin film transistor disposed on the substrate;
a passivation layer covering the thin film transistor; and
a planarization layer disposed on the passivation layer,
wherein the first and second data lines are disposed on the passivation layer, and
the first to third pixel electrodes are disposed on the planarization layer.

19. The display device of claim 18, wherein a distance between the first data line and the first pixel electrode is shorter than a distance between the second data line and the second pixel electrode.

20. The display device of claim 18, wherein a distance between the third data line and the third pixel electrode is shorter than a distance between the second data line and the second pixel electrode.

* * * * *